United States Patent
Lee et al.

(10) Patent No.: US 7,263,653 B2
(45) Date of Patent: Aug. 28, 2007

(54) ALGORITHM FOR A MEMORY-BASED VITERBI DECODER

(75) Inventors: Chen-Yi Lee, Hsinchu (TW);
Chien-Ching Lin, Shueishang Township, Chiayi County (TW);
Chia-Cho Wu, Pingjhen (TW)

(73) Assignee: National Chiao Tung University, Hsinchu (TW)

( * ) Notice: Subject to any disclaimer, the term of this patent is extended or adjusted under 35 U.S.C. 154(b) by 551 days.

(21) Appl. No.: 10/653,054

(22) Filed: Sep. 3, 2003

(65) Prior Publication Data
US 2004/0261005 A1 Dec. 23, 2004

(30) Foreign Application Priority Data
Jun. 20, 2003 (TW) .............................. 92116744 A

(51) Int. Cl.
*H03M 13/03* (2006.01)
(52) U.S. Cl. .................................................... 714/795
(58) Field of Classification Search ................. 714/795
See application file for complete search history.

(56) References Cited

U.S. PATENT DOCUMENTS

| | | | |
|---|---|---|---|
| 4,905,317 A | | 2/1990 | Suzuki et al. |
| 5,208,816 A | | 5/1993 | Seshardi et al. |
| 6,452,985 B1 | * | 9/2002 | Hatakeyama et al. ........ 375/341 |
| 6,560,749 B1 | * | 5/2003 | Cohen .......................... 714/792 |
| 6,591,395 B1 | * | 7/2003 | Tsai ............................. 714/795 |
| 6,690,750 B1 | * | 2/2004 | Hocevar et al. ............. 375/341 |
| 6,868,521 B2 | * | 3/2005 | Cohen .......................... 714/795 |
| 7,035,356 B1 | * | 4/2006 | Langhammer .............. 375/341 |
| 2001/0007142 A1 | * | 7/2001 | Hocevar et al. ............. 714/795 |
| 2001/0023477 A1 | * | 9/2001 | Jarske ......................... 711/154 |
| 2003/0194026 A1 | * | 10/2003 | Vasquez ...................... 375/341 |

* cited by examiner

*Primary Examiner*—Guy Lamarre
*Assistant Examiner*—Sam Rizk
(74) *Attorney, Agent, or Firm*—Rosenberg, Klein & Lee

(57) ABSTRACT

A method of convolutional decoding with a memory-based Viterbi decoder employs the property of a trace-back path; that is, the similarity between two consecutive trace-back paths becomes higher as the data error rate goes down. Therefore, the method of the invention saves the previous trace-back path into a register, and as soon as the current trace-back path is found to be the same as the previous one, the demanded path is obtained. After that, the memory read operations will stop, thereby reducing the power consumption caused by memory read operations. Prior to path trace-back, the path prediction can be executed by utilizing the property that the minimum path metric and the path are consecutive. The invention reduces the number of memory access operations and power consumption by employing the mechanisms of path matching and path prediction.

10 Claims, 4 Drawing Sheets

ALGORITHM FOR A MEMORY-BASED VITERBI DECODER

BACKGROUND OF THE INVENTION

1. Field of the Invention

The invention relates to a decoding method for a memory-based Viterbi decoder and, more particularly, to a decoding method for a Viterbi decoder that applies the mechanisms of path matching and path prediction.

2. Description of the Related Art

Error correction codes have been playing a key role in data transmission because adding them into digitalized data ensures the correctness of data during data transmission. In general, error correction codes can be classified into two categories. One category is a block code, which employs a method to encode data per block, there being no time relation between each block. The other category is a convolutional code, which, unlike the block code, has a time relation existing in the encoding process.

The most common method applied to a convolutional code decoder is the Viterbi algorithm, which is also the most effective decoding algorithm for the convolutional code. A decoder that employs such algorithm is called a Viterbi decoder. During the decoding process, the existing architecture must decode a certain length of data, regardless of whether the data is correct or incorrect, in order to obtain correct data. That certain length of data is referred to as a truncation length. During decoding, a large amount of memory bandwidth is necessary due to the large number of memory access operations required. Typically, however, decoding a smaller amount of data than that of the truncation length is sufficient for judging the precision of data. For this reason, a lot of power is wasted during memory access.

U.S. Pat. No. 5,208,816 illustrates the redundant power consumption. This prior art system provides a memory algorithm for a high-speed Viterbi decoder, which transmits a parity checking code for inspecting the Viterbi decoder and determining data reliability. When unreliable data has been detected, a second round of Viterbi estimation or retransmission will be executed to increase data precision. The method of U.S. Pat. No. 5,208,816 is only suitable for low-speed transmission. Moreover, because a conventional Viterbi decoder is used, which requires a lot of memory bandwidth, low power consumption is difficult to achieve.

Another reference, U.S. Pat. No. 4,905,317, discloses a system which synthesizes the states when executing the path trace-back operation in such a manner as to implement a jumping back effect so that memory access operations can be decreased as well as decoding speed being increased. Unfortunately, even though the decoding speed has been increased, it cannot satisfy the current demand for decoding speed when applied. Additionally, the paths that have been traced back by jumping back must be retraced at the next decoding step, because the data in these paths are likely to be a solution required for subsequently decoded data. This retracing requires many redundant calculations and memory read operations.

The present invention provides a method for a memory-based Viterbi decoder, which employs mechanisms for path matching and path prediction to reduce the number of memory access operations and the power consumption so that the aforementioned shortcomings of the prior art can be overcome.

SUMMARY OF THE INVENTION

The main and first object of the invention is to provide a method for a memory-based Viterbi decoder, which can predict the possible correct path while concurrently calculating the path metrics so that the number of memory access operations can be reduced during subsequent decoding operations. Further, the truncation length required by the decoding can be dynamically adjusted in accordance with a path merging mechanism, which, depending on the error probabilities, can reduce the power consumption associated with the memory access operations during the decoding process.

The second object of the invention is to provide a method for a memory-based Viterbi decoder, which can dynamically adjust the number of memory access operations during the decoding process according to the received state of data. Redundant calculations in real applications are avoided by accepting the received data codes in the error correction circuit to effectively reduce the power consumption of the circuits during operation.

The third object of the invention is to provide a method for a memory-based Viterbi decoder, which can largely reduce the memory read operations so that a high-speed application with low power consumption can be achieved.

The fourth object of the invention is to provide a simple method for achieving the low power consumption so that the method can be cost competitive as well as application competitive.

The method of the invention includes, first, calculating each path according to the inputted data. A path metric is calculated for each path and path metrics are compared to determine a minimum path metric so as to find the state associated therewith. When the state of the minimum path metric is found to be located on a consecutive path, the consecutive path is established as the predicted trace-back path. A merging point is located on the predicted trace-back path while executing the trace-back path procedure, so that the decoding process can proceed to obtain a decoded signal.

The path prediction procedure described above further includes steps of, first, determining the state of the minimum path metric at time t. It is then determined if the state transition sequence from time t−1 to time t is located within the trellis and, if so, the state of the minimum path metric associated with time t is saved in a register. A state for time t+1 is predicted and is saved in the register and is combined with the state of time t stored therein. The path prediction procedure is terminated when the state of the minimum path metric is not located on a consecutive path. Thus, if the path saved in the register is ensured to be correct, the decoding process will be based on the register access.

Moreover, the path matching procedure can be executed concurrently while executing the path trace-back procedure. The path matching procedure includes the following steps: first, saving the trace-back path of the previous moment to the register; next, comparing the current trace-back path to the previous trace-back path; and finally, obtaining the path from the register if the two paths coincide, and the subsequent decoding process utilizes the states stored in the register.

The objects and technical contents of the invention will be better understood through the description of the following embodiments with reference to the drawings.

DETAILED DESCRIPTION OF THE PREFERRED EMBODIMENTS

The path trace-back method is suitable for the Viterbi decoder with a large number of states but low power consumption. However, as the demand for higher decoding speed increases, the demand for memory access bandwidth will become greater, which in turn will increase the power consumption associated with the memory access. In addition, the similarity between two consecutive trace-back paths will become higher as the data error rate goes down. In real application, when the bit error rate (BER) of the inputted data is around $10^2$, ninety-five percent of the trace-back paths will be similar. For this reason, the invention applies the above-mentioned properties as well as the mechanisms of path matching and path prediction so that up to seventy-five percent of the number of memory read operations can be eliminated, thereby reducing the power consumption.

Figure 1:
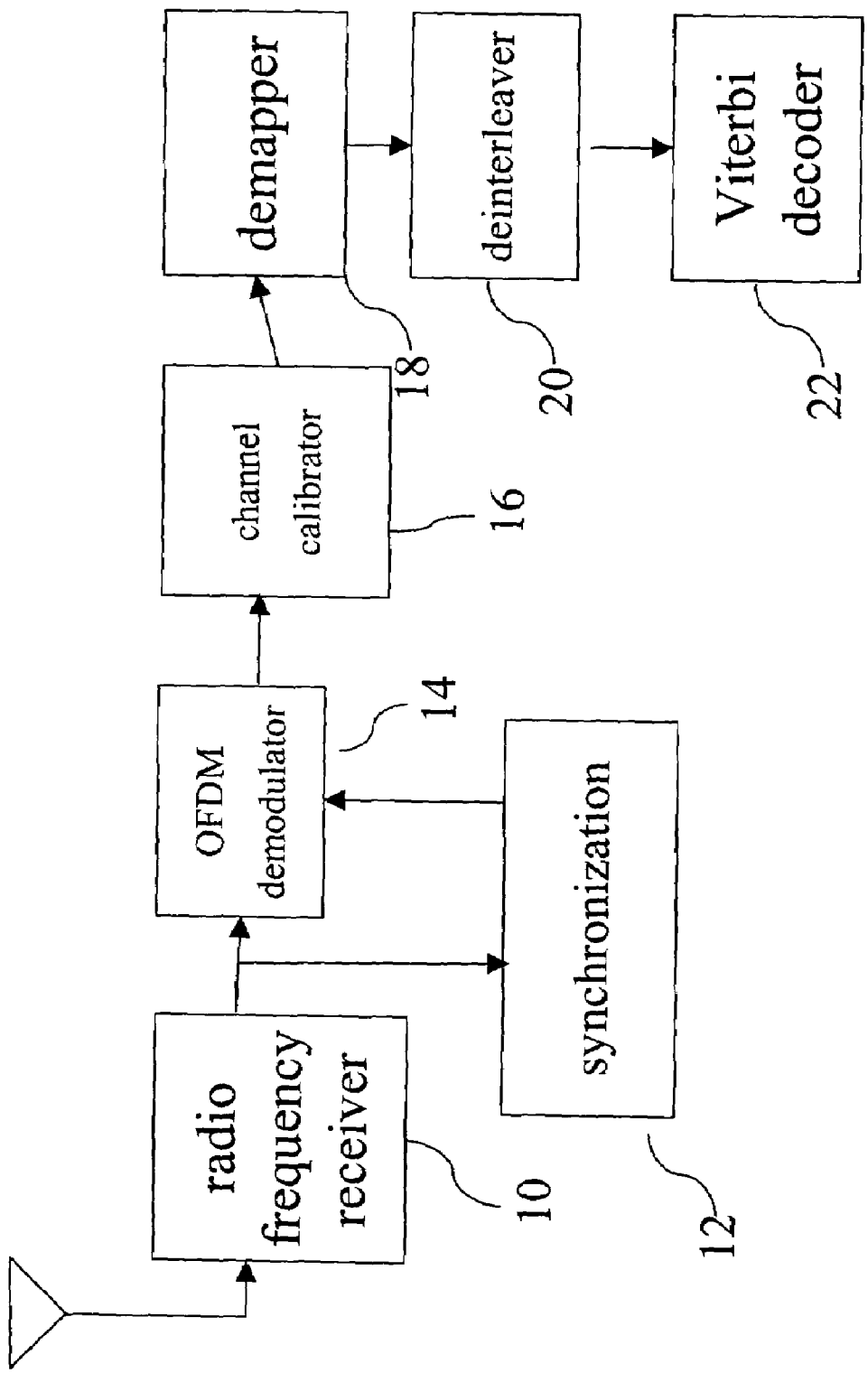
FIG. 1 is a schematic diagram showing the Viterbi decoder being applied to a wireless local area network.

FIG. 1 is a schematic diagram showing the Viterbi decoder is applied to an IEEE 802.11a wireless local area network. As shown in FIG. 1, after the RF receiver 10 has received the radio frequency signals, the following procedures will be executed sequentially: first, the synchronizer 12 will synchronize the signals; second, the demodulator of the orthogonal frequency division multiplexer (OFDM) 14 will demodulate the signals; third, the channel calibrator 16 will calibrate the signals; fourth, the demapper 18 will demap each formatting code; fifth, the deinterleaver 20 will restore to its original location data that has been interleaved with different symbols; and finally, the data will be transmitted to a Viterbi decoder 22 for decoding the convolutional code so as to rectify data errors generated during the transmission.

During Viterbi decoding of the convolutional code, a decoded code length that is smaller than the truncation length will be required to determine the correct data. The invention is capable of predicting the possible correct path concurrently while calculating the path metrics under the memory-based architecture so that the number of memory access operations can be reduced during the subsequent decoding process.

Figure 2:
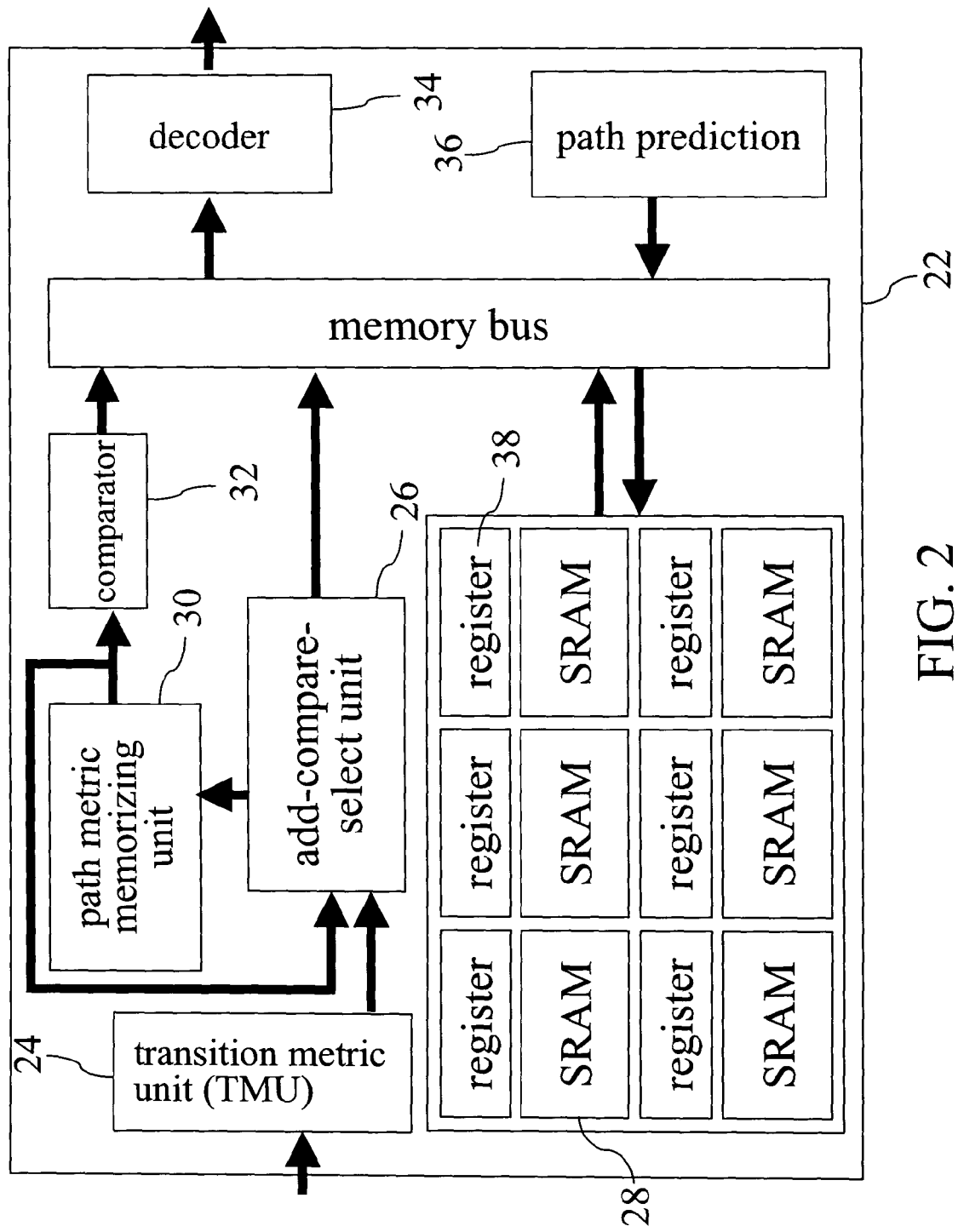
FIG. 2 is a schematic diagram showing the architecture of the Viterbi decoder of the invention.
Figure 3:
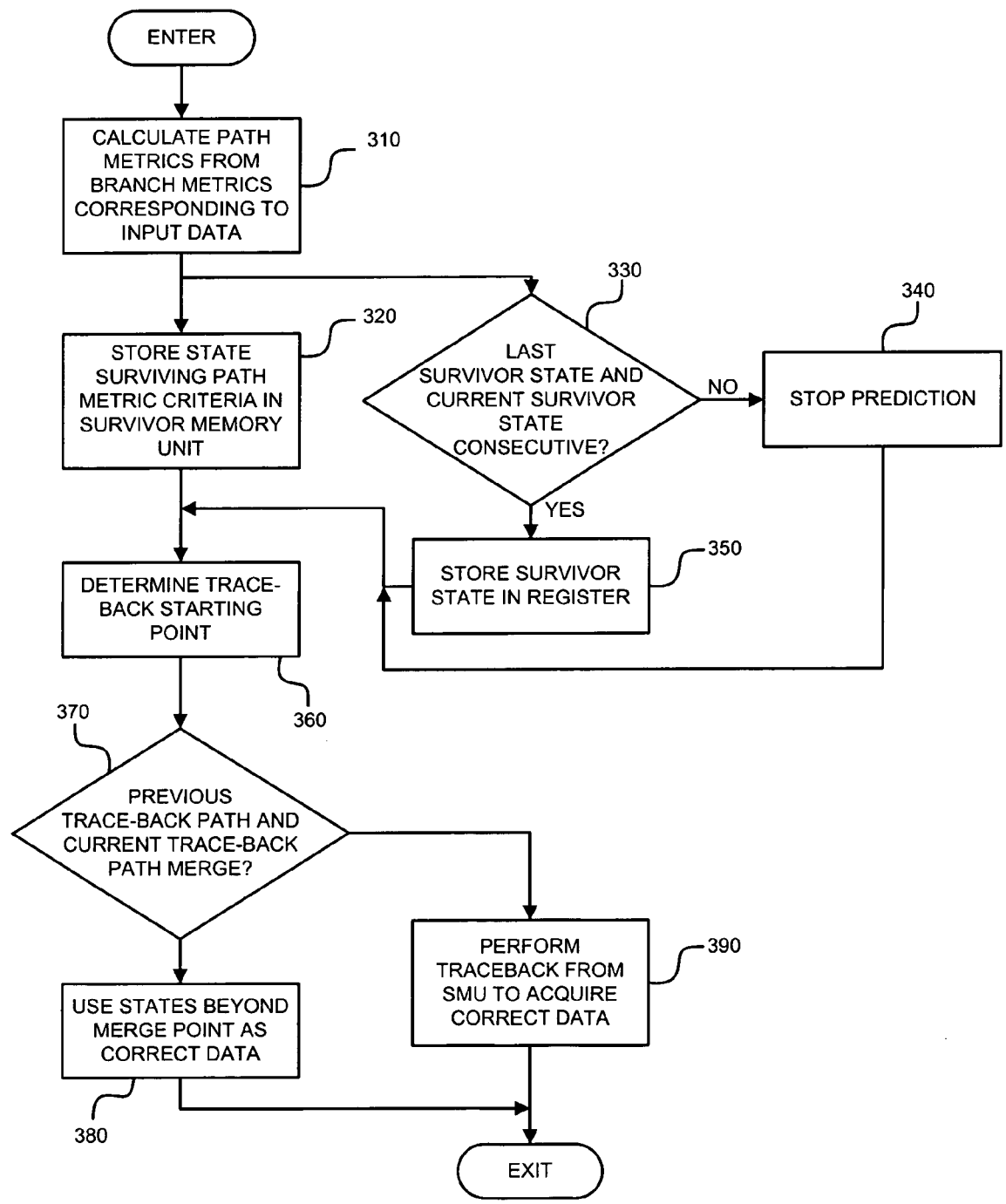
FIG. 3 is a flow diagram depicting fundamental method steps of embodiments of the present invention.

FIG. 2 is a schematic diagram showing the architecture of the Viterbi decoder of the invention, for which the detail steps of the operation thereof are depicted in FIG. 3. The method steps of FIG. 3 are carried out on the memory-based Viterbi decoder 22. As shown in FIG. 2 and FIG. 3, a transition metric unit (TMU) 24 calculates branch metrics according to the inputted data, as shown at block 310. The branch metrics are then transmitted to an add-compare-select unit (ACSU) 26 for path metrics calculation and path selection. The derived path is then stored in the survivor memory unit 28 (SMU), as indicated at block 320. The path metric for each path is retained by a path metric memorizing unit 30. The comparator 32 compares the path metrics to derive a trace-back starting point, as shown at block 360, which is transmitted to a decoder 34. Finally, the decoder 34 performs path trace-back by reading the required data from the survivor memory unit 28 and continuing with the decoding, as shown at block 390.

Figure 4:
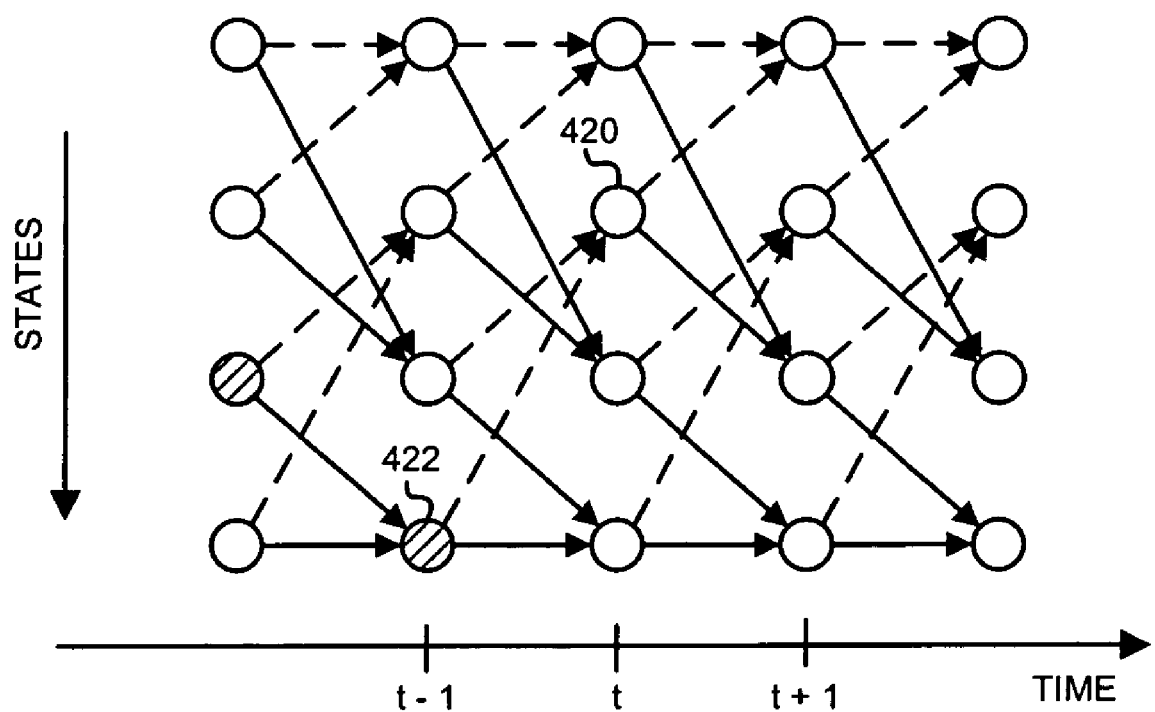
FIG. 4 is a state trellis diagram illustrating aspects of the present invention.

As is shown in FIG. 3, during the path calculation, the path prediction unit 36 operates concurrently to find the state of the minimum path metric according to the path metrics. Then, the next step is to determine whether the state of the minimum path metric is located on a consecutive path, which is illustrated in FIG. 4, where the states of the minimum path metric up to time t are indicated by the hatched circles. In order to make the determination, the state corresponding to the minimum path metric at time t must be found first. Assuming state 420 to be the state corresponding to the minimum path metric at time t, if determined at block 330 that the state transition sequence from the time t−1 to the time t is found to be located in the trellis, such as is shown by state 422, the state 420 corresponding to the minimum path metric at time t will be saved in a register 38 located inside the survivor memory unit 28, as shown at block 350, for reducing memory access during the decoding. Afterwards, the prediction of time t+1 will be performed, and its state will be saved in the register 38 and merged with the state value of time t. Such prediction can be consecutively executed between the adjacent time points, and if the states of the minimum path metrics are located on the same consecutive path, it means that the consecutive path is the desired trace-back path. Conversely, if the values are not located on a consecutive path, the prediction procedure will stop, as shown at block 340. When the prediction of trace-back path is terminated, the decoder 34 will find a merging point to proceed with the decoding according to the trace-back path so as to obtain the demanded decoding signal without decoding to the truncation length.

If the trace-back path has been correctly predicted, it means that the path stored in the register 38 is correct, and thus the decoding will be executed by accessing the register 38.

In addition to executing the path prediction 36, path matching can be performed concurrently or separately. The path matching procedure first stores a previously-traced trace-back path into the register 38 and then traces a current trace-back path. Next, the two trace-back paths at the previous moment and the current moment will be compared, as shown at block 370 of FIG. 3, and when the two paths are found to merge, the demanded path is obtained, as indicated by block 380.

The method of the invention can be implemented through software, multiprocessor, or digital signal processor. Additionally, the method provided by the invention associates the property of path back-trace with the reliability of the inputted data of the Viterbi algorithm. Therefore, the trace-back path can be stored in the register so that there is a good chance to directly use the path in the register at the next trace-back and thus eliminate most of the memory read operations. Moreover, the invention decides the memory read operation on the basis of the reliability of inputted data so that the bandwidth ratio of the memory writing to the memory reading can approximately reach a ratio of 1:1. Finally, the Viterbi decoder can appropriately adjust the decoding calculations according to the accuracy of the inputted data, adds to the efficiency of the Viterbi decoder.

In conclusion, the invention can dynamically adjust the quantity of memory access operations during the decoding process according to the state of the received data so that the redundant calculations can be eliminated in the error correction circuit by utilizing the property of the received data codes. Therefore, when the circuits are in real operation, the number of memory access operations and power consumption can be reduced, which in turn can achieve a high-speed application with low power consumption. Hence, the invention is able to achieve low-power consumption with a simple method, which in turn proves that the invention can be very competitive in cost saving and practical.

The embodiments above are only intended to illustrate the invention; they do not, however, limit the invention to the specific embodiments. Accordingly, various modifications and changes may be made without departing from the spirit and scope of the invention as described in the appended claims.

What is claimed is:

1. A method of decoding convolutionally encoded data by a Viterbi decoder, the encoded data including a plurality of encoded data symbols, the method including the steps of:
   providing to the decoder at least one register for storing decoder state information therein, the register being removed from a survivor memory for storing decoder state information therein;
   receiving sequentially at the decoder the encoded data one encoded symbol per instance of time;
   selecting at each time instant a decoder state corresponding to a decoder state transition from a previous decoder state of an immediately prior time instance, the decoder state being selected in accordance with transition criteria established for transitions between sequential decoder states, a sequence of such state transitions defining a state-transition path through possible states of the decoder;
   storing the selected decoder state in the survivor memory;
   selecting at each time instant a decoder state corresponding to a minimum path metric determined from the transition criteria accumulated over a predetermined number of the time instances;
   determining whether the selected state corresponding to the minimum path metric is a decoder state corresponding to an allowable transition from a decoder state corresponding to the minimum path metric at the immediately prior time instance;
   storing upon a positive determination of the allowable transition the selected state corresponding to the minimum path metric in the register with other states so stored;
   locating on a trace-back path defined by the states in the register a state common to other state-transition paths stored for trace-back; and
   decoding states in the state-transition path preceding the common state to obtain a decoded signal.

2. The method of decoding convolutionally encoded data by a Viterbi decoder as claimed in claim 1, wherein the minimum path metric state selecting step is performed concurrently with the state-transition path defining step.

3. The method of decoding convolutionally encoded data by a Viterbi decoder as claimed in claim 1, wherein the decoding step includes the step of decoding states not stored in the register via a trace-back procedure executed thereon as stored in the survivor memory, the number of states decoded from the register being smaller than a truncation length of the decoder.

4. The method of decoding convolutionally encoded data by a Viterbi decoder as claimed in claim 1, wherein the minimum path metric state selecting step is performed at sequential instances of time until a state is selected that does not correspond to an allowable transition from a decoder state corresponding to the minimum path metric at the immediately prior time instance.

5. The method of decoding convolutionally encoded data by a Viterbi decoder as claimed in claim 1, including the steps of:
   storing states of a trace-back path in the register;
   comparing a trace-back path to the trace-back path stored in the register;
   determining if and when the two trace-back paths merge to a common state; and
   accepting as decoded data states in the state-transition path preceding the common state.

6. The algorithm for a memory-based method of decoding convolutionally encoded data by a Viterbi decoder as claimed in claim 5, wherein decoded data accepting step includes the step of using as the decoded data states preceding the common state in the register.

7. A method of decoding convolutionally encoded data by a Viterbi decoder, the encoded data including a plurality of encoded data symbols, the method including the steps of:
   providing to the decoder at least one register for storing decoder states therein, the register being removed from a survivor memory for storing decoder states therein;
   receiving sequentially at the decoder the encoded data one encoded symbol per instance of time;
   selecting at each time instance a decoder state corresponding to a decoder state transition from a previous decoder state of an immediately prior time instance, the decoder state being selected in accordance with transition criteria established for transitions between sequential decoder states, a sequence of such state transitions defining a state-transition path through possible states of the decoder;
   storing the selected decoder state in the survivor memory;
   selecting at each time instant a decoder state corresponding to a minimum path metric determined from the transition criteria accumulated over a predetermined number of time instances;
   determining whether the selected state corresponding to the minimum path metric is a decoder state corresponding to an allowable transition from a decoder state corresponding to the minimum path metric at the immediately prior time instance;
   storing upon positive determination of the allowable transition the selected state corresponding to the minimum path metric in the register with other states so stored, the states in the register defining a current trace-back path;
   locating a merging state by comparing the current trace-back path stored in the register to another state-transition path stored for trace-back path; then the merging state being a state common to both trace-back paths; and
   decoding states in the state-transition path preceding the merging state to obtain a decoded signal.

8. The method of decoding convolutionally encoded data by a Viterbi decoder as claimed in claim 7, wherein the minimum path metric state selecting step is performed concurrently with the state-transition path defining step.

9. The method of decoding convolutionally encoded data by a Viterbi decoder as claimed in claim 7, wherein the decoding step includes the step of decoding states not stored in the register via a trace-back procedure executed thereon as stored in the survivor memory, the number of states decoded from the register being smaller than a truncation length of the decoder.

10. The method of decoding convolutionally encoded data by a Viterbi decoder as claimed in claim 7, wherein minimum path metric state determining step is performed at sequential instances of time until a state is selected that does not correspond to an allowable transition from a decoder state corresponding to the minimum path metric at the immediately prior time instance.

* * * * *